United States Patent
Wada et al.

(10) Patent No.: US 9,335,184 B2
(45) Date of Patent: May 10, 2016

(54) MALFUNCTION DETECTION DEVICE FOR RESOLVER

(75) Inventors: Shunichi Wada, Chiyoda-ku (JP);
Takayuki Yamamoto, Chiyoda-ku (JP);
Ryoichi Yonezawa, Chiyoda-ku (KR);
Masaki Matsushita, Chiyoda-ku (JP);
Katsuya Ikemoto, Chiyoda-ku (KR)

(73) Assignee: Mitsubishi Electric Corporation, Tokyo (JP)

( * ) Notice: Subject to any disclaimer, the term of this patent is extended or adjusted under 35 U.S.C. 154(b) by 871 days.

(21) Appl. No.: 13/157,737

(22) Filed: Jun. 10, 2011

(65) Prior Publication Data
US 2012/0185213 A1 Jul. 19, 2012

(30) Foreign Application Priority Data

Jan. 13, 2011 (JP) .................................... 2011-4922

(51) Int. Cl.
*G06F 11/30* (2006.01)
*G01D 3/08* (2006.01)
*G01D 5/20* (2006.01)

(52) U.S. Cl.
CPC ... *G01D 3/08* (2013.01); *G01D 5/20* (2013.01)

(58) Field of Classification Search
CPC .............................. G05B 23/02; G05B 23/0205
USPC ........................................................ 702/183
See application file for complete search history.

(56) References Cited

U.S. PATENT DOCUMENTS

| 4,894,782 | A * | 1/1990 | Alcock et al. ................. 701/100 |
| 7,755,317 | B2 * | 7/2010 | Yu et al. ......................... 318/721 |
| 8,191,370 | B2 * | 6/2012 | Shimizu et al. ................. 60/607 |
| 2008/0052562 | A1 | 2/2008 | Kameya et al. |
| 2008/0239904 | A1 * | 10/2008 | Yoshida et al. ............. 369/53.17 |
| 2009/0206828 | A1 * | 8/2009 | Yamaura et al. ......... 324/207.25 |

FOREIGN PATENT DOCUMENTS

JP 2006177750 A 7/2006

OTHER PUBLICATIONS

Communication dated Jun. 10, 2015, issued by the Intellectual Property Office of France in counterpart Application No. 1156032.

* cited by examiner

*Primary Examiner* — Tung S Lau
*Assistant Examiner* — Xiuquin Sun
(74) *Attorney, Agent, or Firm* — Sughrue Mion, PLLC; Richard C. Turner

(57) ABSTRACT

A malfunction detection device for a resolver detects malfunction in a resolver with accuracy and stability even if a value of a square sum is varied between inside and outside of a normal range. When the resolver is in malfunction, a sine signal and a cosine signal are read. It is determined whether a malfunction determination of the resolver is prohibited, or not, from read values of the sine signal and the cosine signal, or square values thereof. When it is determined that the malfunction determination of the resolver is prohibited, the count value is accumulated and incremented every time the test value falls outside a normal range. When the count value arrives at a given value or higher, it is determined that the resolver is in malfunction.

12 Claims, 12 Drawing Sheets

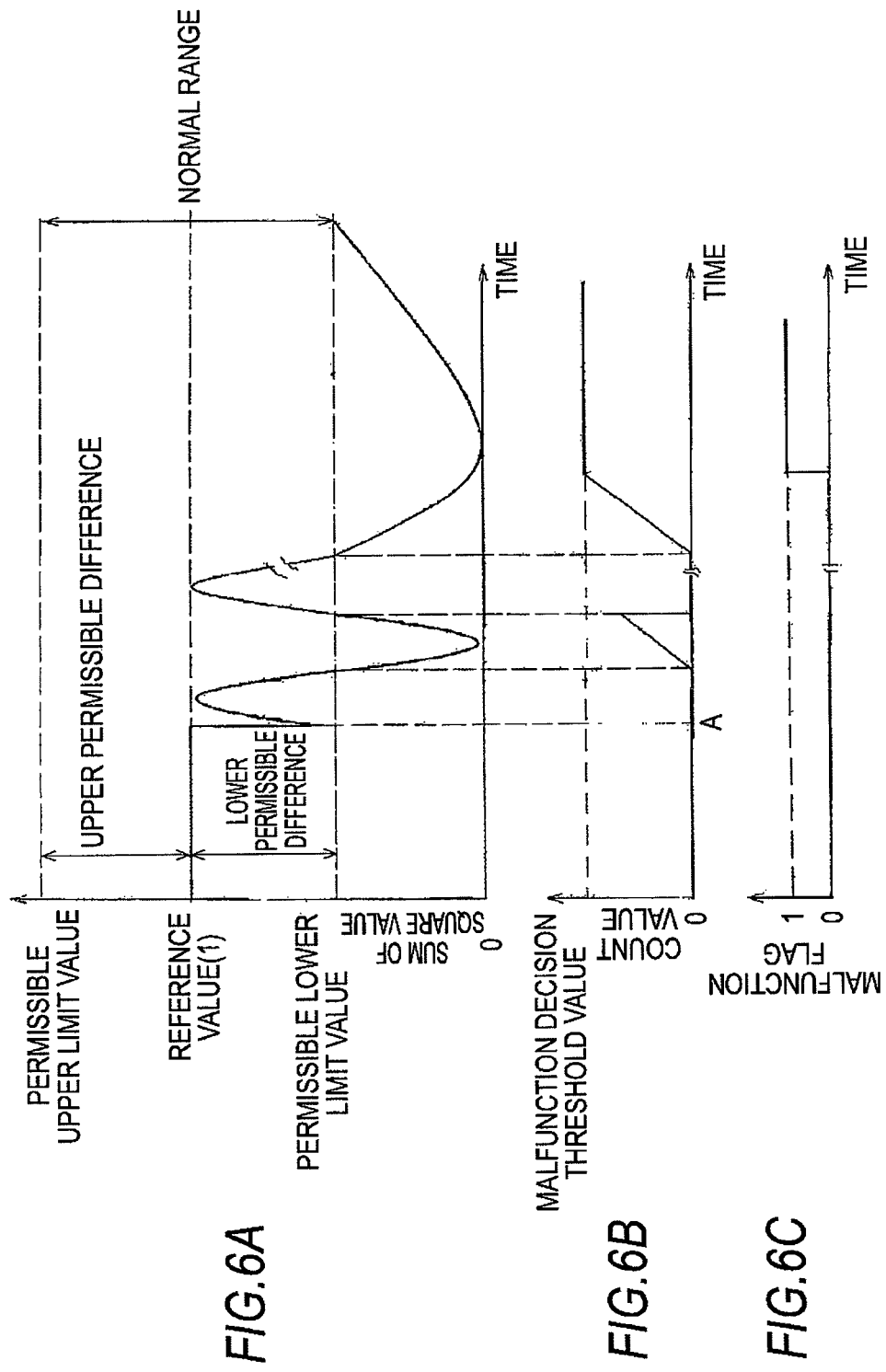

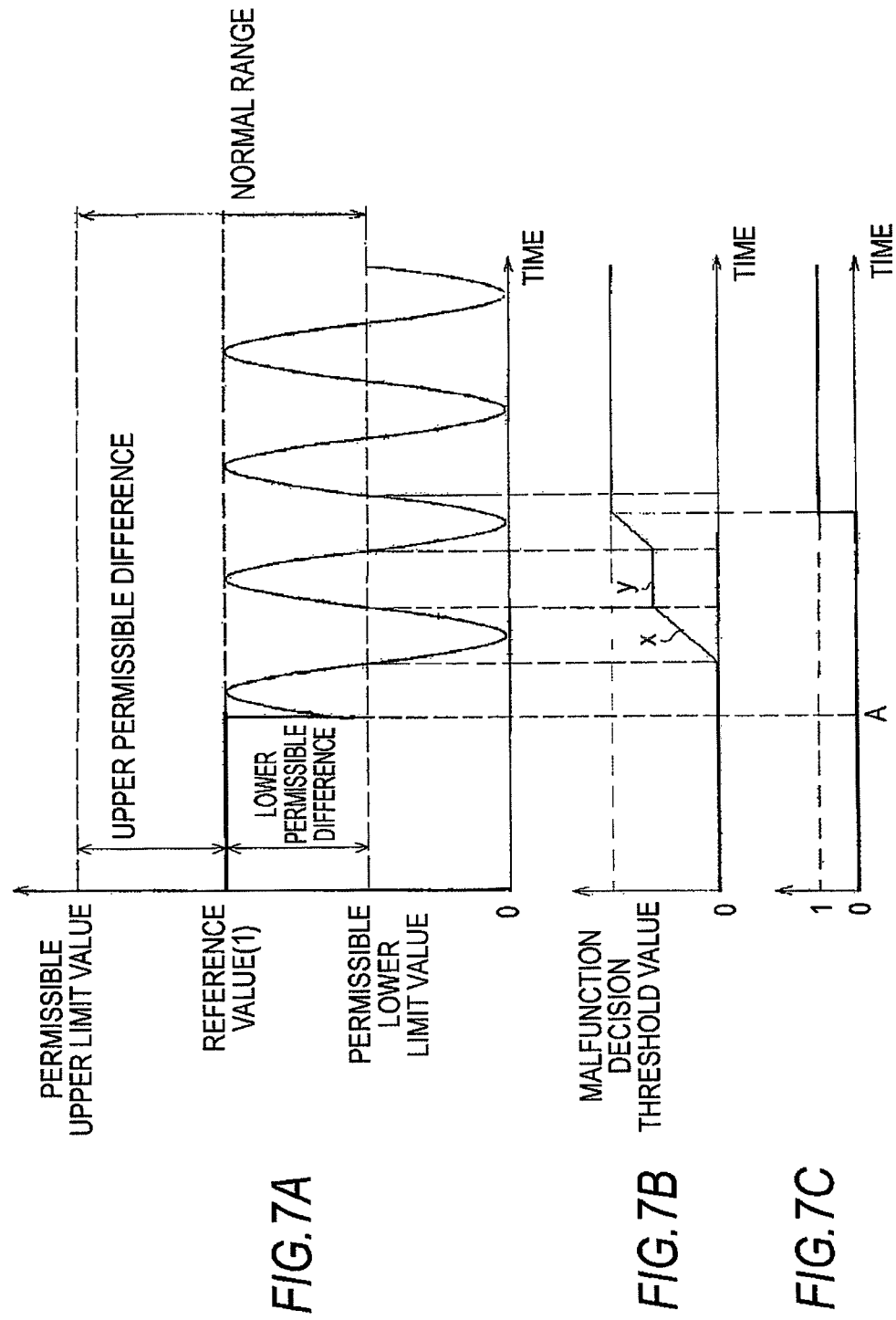

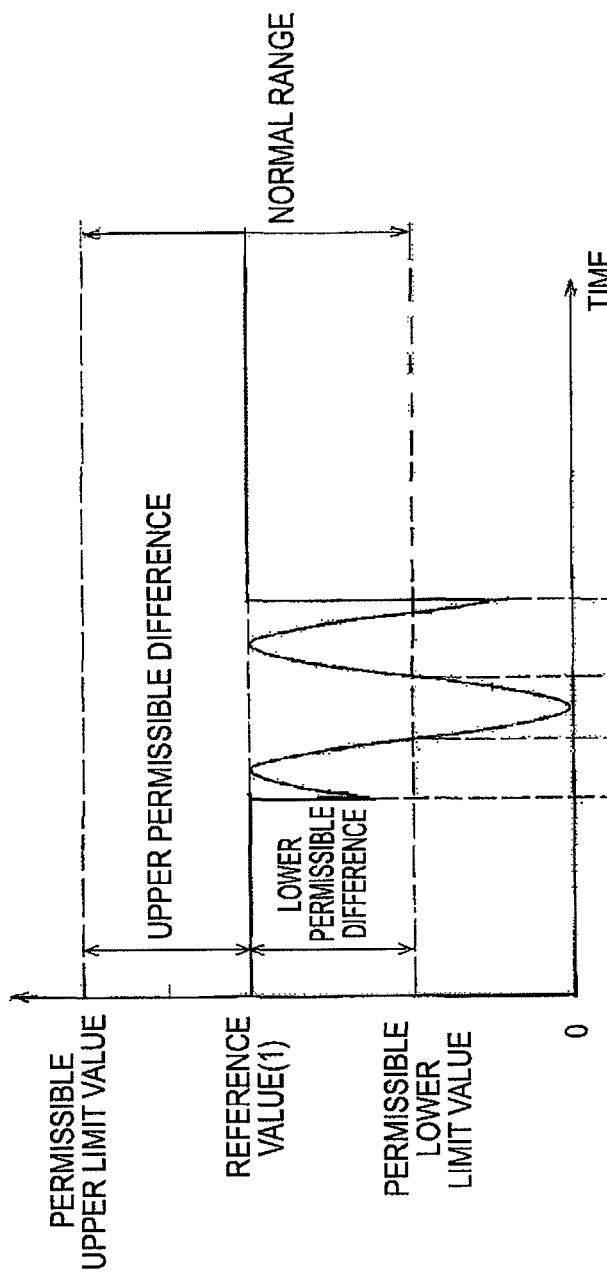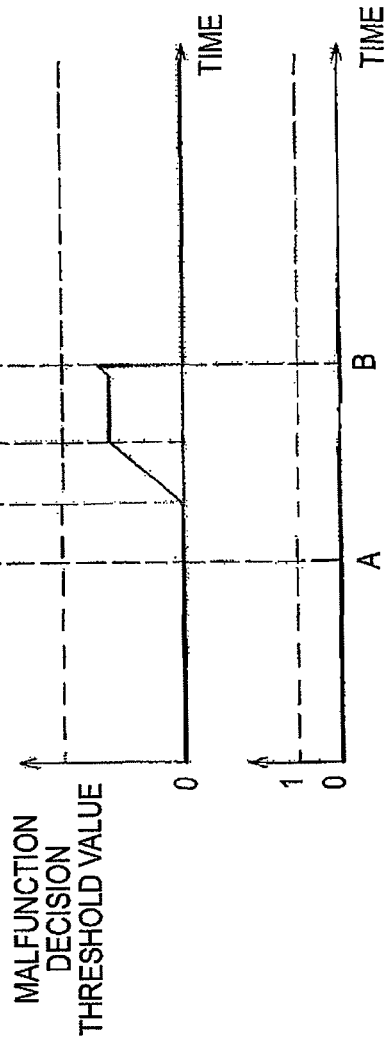

MALFUNCTION DETECTION DEVICE FOR RESOLVER

BACKGROUND OF THE INVENTION

1. Field of the Invention

The present invention relates to a malfunction detection device for a resolver, which outputs a sine signal representative of sin θ and a cosine signal representative of cos θ according to a rotation angle θ of a rotating body.

2. Description of the Related Art

One of malfunction detection devices for a resolver of this type has been proposed in, for example, JP-A-9-72758 (refer to paragraph [0020] and FIG. 5). In the malfunction detection device for a resolver disclosed in JP-A-9-72758, a value of $\sin^2 θ + \cos^2 θ$ is calculated on the basis of the sine signal and the cosine signal, and when a calculated value falls outside a given normal range, it is determined that malfunction occurs within the resolver.

However, when malfunction occurs in the resolver, the value of $\sin^2 θ + \cos^2 θ$ (the sum of squares) may be varied between inside and outside of the above normal range according to the rotation angle θ of the rotating body. In this case, since a state in which the value of $\sin^2 θ + \cos^2 θ$ falls outside the normal range is not continued, even if malfunction occurs in the resolver, the malfunction may not be surely detected. In addition, even if the resolver is normal, because the value of $\sin^2 θ + \cos^2 θ$ may temporarily fall outside the normal range due to an influence of noise, for example, the normal resolver may be determined as fault.

SUMMARY OF THE INVENTION

The present invention has been made in view of the above problem, and therefore an object of the present invention is to provide a malfunction detection device for a resolver, which can detect malfunction in the resolver with accuracy and stability even if the above value of the sum of squares may be varied between inside and outside of the above normal range.

According to the present invention, there is provided a malfunction detection device for a resolver, which is attached to the resolver that outputs a sine signal representative of sin θ and a cosine signal representative of cos θ according to a rotation angle θ of a rotating body, and detects malfunction in the resolver, the malfunction detection device comprising:

a test value calculation unit that calculates a test value on the basis of at least one of the sine signal and the cosine signal;

a malfunction detection unit that determines malfunction in the resolver according to whether the test value falls within a normal range, or not;

a unit that prohibits the determination of fault detection unit when at least one of the sine signal and the cosine signal falls outside a fault determination region;

a count unit that counts a count value with time when the malfunction detection unit determines that the resolver is in malfunction;

a reset unit that resets the count value when the malfunction detection unit determines that the resolver is out of malfunction; and a malfunction decision unit that decides that the resolver is in malfunction when the count value is equal to or higher than a malfunction decision threshold value.

According to the present invention, even if at least one of the sine signal and the cosine signal is varied between inside and outside of the normal range, and also even if at least one value of the sine signal and the cosine signal temporarily falls outside the normal range due to an influence of noise, for example, malfunction in the resolver can be detected with accuracy and stability.

The foregoing and other object, features, aspects, and advantages of the present invention will become more apparent from the following detailed description of the present invention when taken in conjunction with the accompanying drawings.

BRIEF DESCRIPTION OF THE DRAWINGS

FIGS. 6A to 6C are timing charts showing an example of the operation of a resolver malfunction detection unit when a conventional malfunction detection device for a resolver disclosed in JP-A-9-72758 is in malfunction;

FIGS. 7A to 7C are timing charts showing an example of the operation of a resolver malfunction detection unit when the malfunction detection device for a resolver according to the first embodiment of the present invention is in malfunction;

FIGS. 8A to 8C are timing charts showing an example of another operation of the resolver malfunction detection unit of FIGS. 7A to 7C;

DETAILED DESCRIPTION OF THE PREFERRED EMBODIMENTS

First Embodiment

Figure 1:
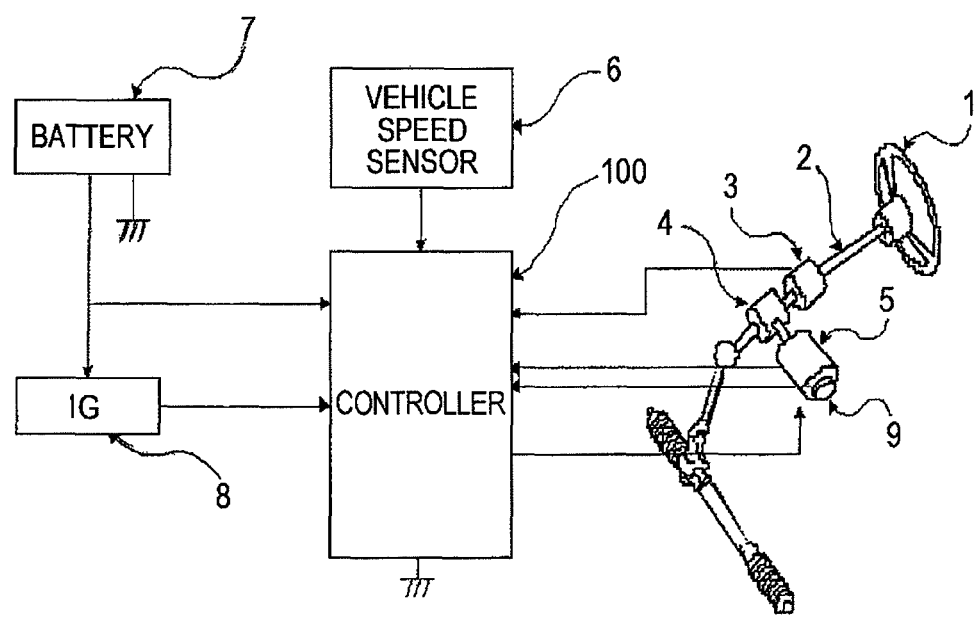
FIG. 1 is a configuration diagram of a power steering control unit implementing a malfunction detection device for a resolver according to the present invention.

A first embodiment of the present invention will be described with reference to the accompanying drawings. FIG. 1 is a configuration diagram of a power steering control unit for a vehicle using a malfunction detection device for a resolver according to the present invention. A permanent magnet synchronous motor (hereinafter referred to as "PM motor") 5 that develops a steering assist torque is connected to one end of a steering shaft 2 through a reduction gear 4. A steering wheel 1 is connected to the other end of the steering shaft 2. Also, a torque sensor 3 that detects a steering torque of the steering wheel 1 is connected to the steering shaft 2.

A controller 100 corresponds to a resolver malfunction detection device according to the present invention. The controller 100 determines the steering assist torque on the basis of a torque detection value of the torque sensor 3 and a vehicle speed detection value of a vehicle speed sensor 6, and drives the PM motor 5 according to a rotor position detected by a resolver 9 to assist the steering of the steering wheel 1.

A battery 7 applies a voltage to the controller 100 directly or through the operation of an ignition key 8.

Figure 2:
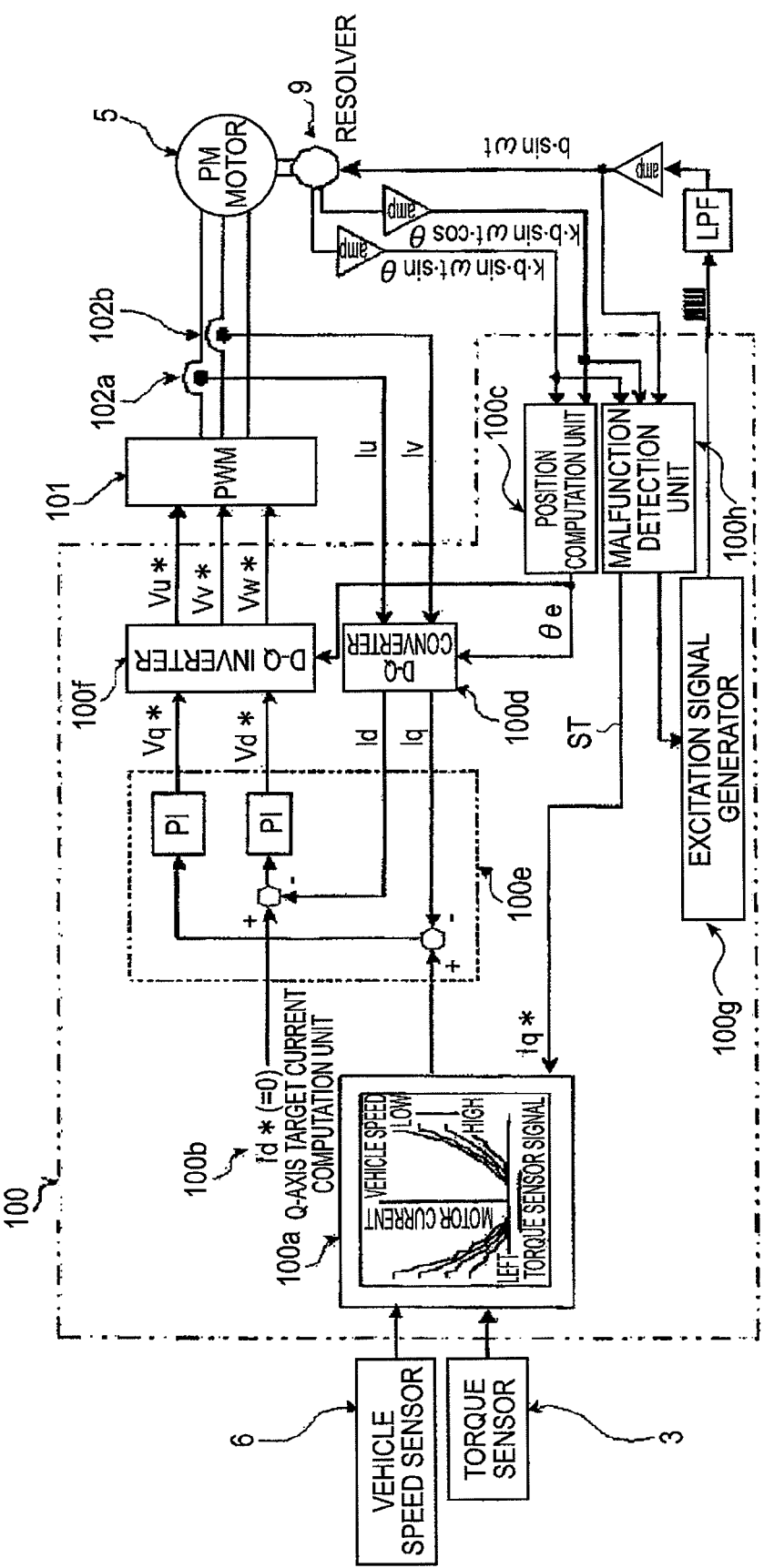
FIG. 2 is a block diagram functionally illustrating the malfunction detection device for a resolver according to the first embodiment of the present invention.

FIG. 2 is a block diagram functionally illustrating a software configuration of the malfunction detection device for a resolver. In this embodiment, the combination of an octal motor (2m=8, m=4) and a tetrapolar resolver (2n=4, n=2) will be exemplified. Symbols m and n are natural numbers.

Referring to FIG. 2, the controller 100 is configured by a microcomputer. The controller 100 includes a q-axis target current computation unit 100a, a d-axis target current setting unit 100b (detailed configuration is omitted), a position computation unit 100c, a d-q converter 100d, a current controller 100e, a d-q inverter 100f, an excitation signal generator 100g, and a malfunction detection unit 100h.

The q-axis target current computation unit 100a conducts given computation on the basis of a torque detection signal from the torque sensor 3 that detects the steering torque and a vehicle speed detection signal from the vehicle speed sensor 6 that detects the vehicle speed to determine a q-axis target current value (Iq*) for driving the PM motor. 5. The q-axis target current computation unit 100a then supplies the determined q-axis target current value to the current controller 100e. However, when a motor drive stop signal is supplied from the malfunction detection unit 100h, the q-axis target current computation unit 100a supplies a q-axis target current to the current controller 100e as 0, and the d-axis target current setting unit 100b supplies a d-axis target current to the current controller 100e as 0.

Figure 3A:
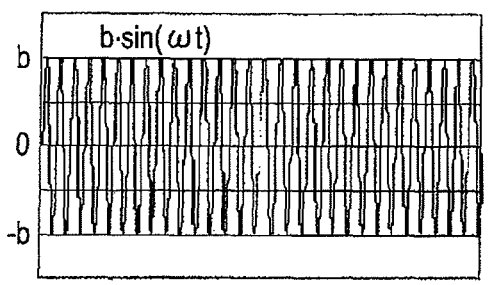
FIGS. 3A to 3E are signal waveform diagrams of the resolver according to the first embodiment of the present invention.
Figure 3B:
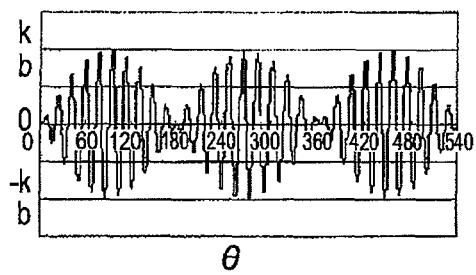
Figure 3C:
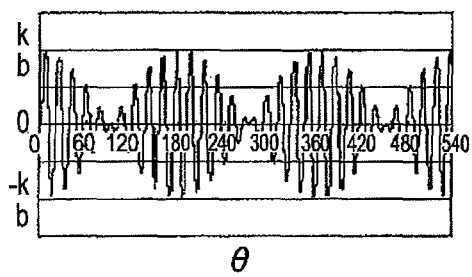

The excitation signal generator 100g generates a pulse signal of 10 kHz for generating an excitation signal of the resolver 9. The pulse signal is shaped in waveform by an LPF, and input to the resolver 9 as an excitation signal b·sin ωt (refer to FIG. 3A). Reference symbol b denotes an excitation signal amplitude obtained by sampling a signal regarded as an amplitude of the resolver excitation signal. When it is assumed that a transformation ratio of the resolver 9 is k, the resolver 9 outputs a signal k·b·sin θ·sin ωt (refer to FIG. 3B) obtained by modulating the magnitude of the excitation signal by sin θ according to the rotor angle θ, and a signal k·b·cos θ·sin ωt (refer to FIG. 3C) obtained by modulating the magnitude of the excitation signal by cos θ.

Figure 3D:
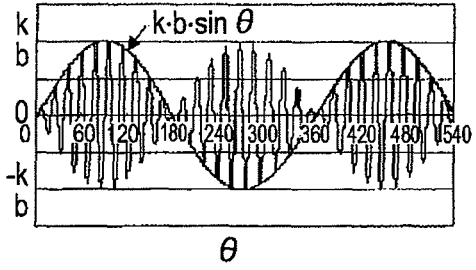
Figure 3E:
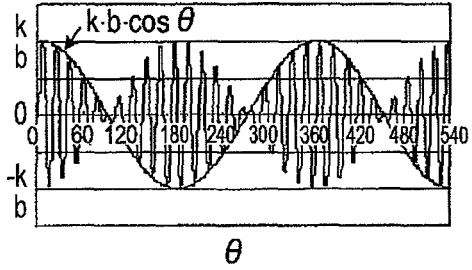

The position computation unit 100c calculates a resolver position θ from a relationship of θ=a tan(sin θ/cos θ) on the basis of information (FIGS. 3D and 3E) on k·b·sin θ and k·b·cos θ obtained by sampling signals regarded as the amplitudes of the signal modulated in amplitude by sin θ and the signal modulated in amplitude by cos θ. Reference symbol a is an amplitude.

Also, since an octal motor (m=4) is provided for a tetrapolar resolver (n=2), a motor electric angle θe is computed from a relationship of θe=(m/n)*θ=2*θ, and θe is supplied to the d-q converter 100d and the d-q inverter 100f.

The d-q converter 100d conducts 3-phase to 2-phase conversion (dq conversion) on the basis of phase current values (Iu,Iv) detected by current sensors 102a and 102b, and the electric angle θe. The d-q converter 100d supplies the converted dp axis currents (Id,Iq) to the current controller 100e.

The current controller 100e conducts PI control on the basis of a deviation between dq axis target currents (Id*, Iq*) and the detected dq axis currents (Id,Iq), and generates dp axis target applied voltages (Vd*, Vq*). Also, the d-q inverter 100f conducts 2-phase to 3-phase conversion (dq reverse conversion) on the basis of the dq axis target currents (Vd*, Vq*) and the electric angle θe, and supplies 3-phase target applied voltages (Vu*, Vv*, Vw*) to a driver 101.

Figure 4:
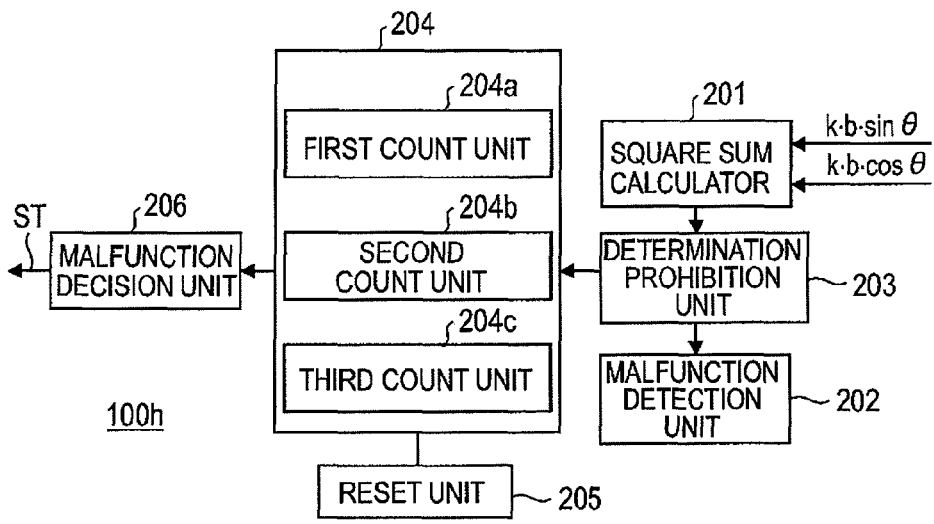
FIG. 4 is a block diagram illustrating a specific configuration example of a malfunction detection unit illustrated in FIG. 2.

As illustrated in FIG. 4, the malfunction detection unit 100h includes: a test value calculation unit 201 that calculates a test value on the basis of at least one of the sine signal and the cosine signal; and a malfunction detection unit 202 that determines whether the resolver is in malfunction, or not, on the basis of the above test value. The malfunction detection unit 100h also includes: a prohibition unit 203 that prohibits the determination of fault detection unit on the basis of at least one of the sine signal and the cosine signal; and a count unit 204 that counts a count value with time when the malfunction detection unit 202 determines that the resolver is in malfunction. The malfunction detection unit 100h further includes: a reset unit 205 that resets the count value when the malfunction detection unit 202 determines that the resolver is out of malfunction; and a malfunction decision unit 206 that decides that the resolver is in malfunction on the basis of the count value.

The test value calculation unit 201 includes, for example, a square sum calculator that calculates, as a test value, a square sum of the sine signal k·b·sin θ and the cosine signal k·b·cos θ obtained by sampling signals regarded as the amplitudes of the signal modulated in amplitude by sine and the signal modulated in amplitude by cos θ. The test value calculation unit 201 calculates a malfunction determination threshold value as $\{a \cdot \cos((\pi/2)/(m/n))\}^2 (=\{k \cdot b \cdot \cos(45 \deg)\}^2)$ on the basis of a value $a^2$ regarded as normal, which is calculated as $a^2 = \{k \cdot b\}^2$ according to the excitation signal amplitude b and a transformation ratio k of the resolver which has been stored in advance. Alternatively, the test value calculation unit 201 stores a malfunction determination threshold value calculated in advance on the basis of the resolver excitation signal amplitude b and the resolver transformation ratio k without provision of the above resolver excitation signal monitor circuit, and determines malfunction on the basis of those malfunction determination threshold values.

Also, the prohibition unit 203 prohibits or permits at least one of fault and normal determinations on the basis of at least one value or square value of the sine signal k·b·sin θ and the cosine signal k·b·cos θ, or on the basis of a relative value thereof, and detects the malfunction or normal of the resolver with accuracy.

Figure 5:
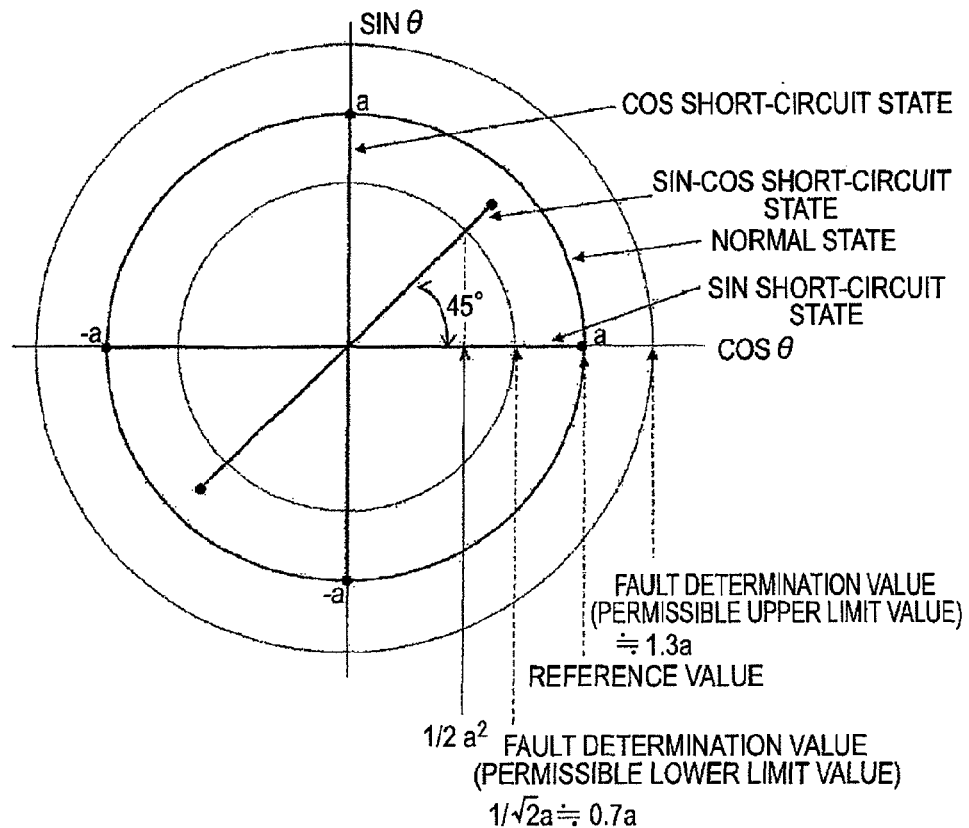
FIG. 5 is a diagram illustrating a relationship between an electric angle and a resolver angle according to the first embodiment of the present invention.

FIG. 5 illustrates a Lissajous waveform and a fault determination region of the sine signal k·b·sin θ and the cosine signal k·b·cos θ of the resolver. Referring to FIG. 5, an example of malfunction detection by the count unit 204 when the resolver is in a short-circuit fault will be described.

When the sine signal line of the resolver is in the short-circuit fault, because a sine signal sin θ information input to the position computation unit 100c becomes 0, a computed value of a resolver position θ (electric angle) represents the malfunction operation only at 0 degrees or 180 degrees on coordinates illustrated in FIG. 5. The Lissajous waveform represents the operation of reciprocating on a cos θ axis between a point "a" and its reverse point "−a" in FIG. 5.

When the determination threshold value of malfunction is set to $\frac{1}{2}a^2$ or lower, a value (range) of normal conversion of the resolver position θ (electric angle) determinable as fault becomes in a range of from 45 degrees to 135 degrees, and in a range of from 225 degrees to 315 degrees. In this state, a value outside the above ranges is determined as normal. That is, during rotation of the resolver, even if the resolver is in malfunction, the determination is varied between normal and malfunction.

In this embodiment of the present invention, when a value of the cosine signal falls within $k \cdot b \cdot \cos \theta > 1/\sqrt{2}xa$ or $(k \cdot b \cdot \cos \theta)^2 > \frac{1}{2}a^2$ (normal state) corresponding to outside of the fault determination region, determination of fault is prohibited. Even if a relationship between the test value of the malfunction determination of the resolver and the malfunction determination threshold value satisfies $(k \cdot b \cdot \sin \theta)^2 + (k \cdot b \cdot \cos \theta)^2 > \frac{1}{2}a^2$, a count value of an appropriate malfunction count unit 204a is not reset. Only when the value of the cosine signal falls within $k \cdot b \cdot \cos \theta < 1/\sqrt{2}xa$ or $(k \cdot b \cdot \cos \theta)^2 < \frac{1}{4}a^2$ corresponding to a fault determinable region, the determination of fault and normal is permitted. When the value satisfies $(k \cdot b \cdot \sin \theta)^2 + (k \cdot b \cdot \cos \theta)^2 < \frac{1}{2}a^2$, the count value of the count unit 204a is gradually incremented. When the value satisfies $(k \cdot b \cdot \sin \theta)^2 + (k \cdot b \cdot \cos \theta)^2 > \frac{1}{2}a^2$, the count value of the count unit 204a is reset.

In this embodiment, the resolver sine signal line is in the short-circuit fault. When the resolver cosine signal line is in the short-circuit fault, the cosine signal $\cos \theta$ information input to the position computation unit 100c becomes 0. Therefore, the Lissajous waveform represents the operation of reciprocating on a $SIN \theta$ axis between the point a and the reverse point −a in FIG. 4.

In this case, likewise, with the aid of another malfunction count unit 204b independent of a case in which the resolver sine signal line is in the short-circuit fault, when a value of the sine signal falls within $k \cdot b \cdot \sin \theta > 1/\sqrt{2}xa$ or $(k \cdot b \cdot \sin \theta)^2 > \frac{1}{2}a^2$ (normal state) corresponding to outside of the fault determination region, the determination of fault is prohibited. Even if a relationship between the test value of the malfunction determination of the resolver and the malfunction determination threshold value satisfies $(k \cdot b \cdot \sin \theta)^2 + (k \cdot b \cdot \cos \theta)^2 > \frac{1}{2}a^2$, a count value of an appropriate malfunction count unit 204b is not reset. Only when the value of the sine signal falls within $k \cdot b \cdot \sin \theta < 1/\sqrt{2}xa$ or $(k \cdot b \cdot \sin \theta)^2 < \frac{1}{4}a^2$ corresponding to a fault determinable region, the determination of fault and normal is permitted. When the value satisfies $(k \cdot b \cdot \sin \theta)^2 + (k \cdot b \cdot \cos \theta)^2 < \frac{1}{2}a^2$, the count value of the count unit 204b is gradually incremented. When the value satisfies $(k \cdot b \cdot \sin \theta)^2 + (k \cdot b \cdot \cos \theta)^2 > \frac{1}{2}a^2$, the count value of the count unit 204b is reset.

Subsequently, an example of malfunction detection at the time of fault in which the sine signal line and the cosine signal line of the resolver are mutually short-circuited will be described. In this case, since the signal waveform of the sine signal and the cosine signal becomes a mean value of the signals when both of those signals are normal, $\frac{1}{2} \times (k \cdot b \cdot \sin \theta + k \cdot b \cdot \cos \theta)$ becomes $\frac{1}{2} \times \sqrt{2}xk \cdot b \cdot \sin(\theta + \pi/4)$ from a formula of a trigonometric function. Because information on the sine signal $\sin \theta$ and the cosine signal $\cos \theta$, which are input to the position computation unit 100c, is identical with each other, a computation value of the resolver position $\theta$ (electric angle) represents the operation of malfunction only at 45 degrees or 225 degrees.

When the determination value of malfunction is equal to or lower than $\frac{1}{2}a^2$, a value (range) of the resolver position $\theta$ (electric angle) determinable as fault becomes in a range of from 90 degrees to 180 degrees, and in a range of from 270 degrees to 360 degrees. In this state, even if the resolver is in malfunction during rotation of the resolver, the determination is varied between normal and malfunction. On the other hand, according to the present invention, when the respective values of the sine signal and the cosine signal, which are mutually short-circuited, fall within $k \cdot b \cdot \cos \theta > 1/\sqrt{2}xa$ or $(k \cdot b \cdot \cos \theta)^2 > \frac{1}{4}a^2$, or $k \cdot b \cdot \sin \theta > 1/\sqrt{2}xa$ or $(k \cdot b \cdot \sin \theta)^2 > \frac{1}{4}a^2$ (normal state) corresponding to outside of the fault determination region, determination of fault is prohibited. Even if those values satisfy $(k \cdot b \cdot \sin \theta)^2 + (k \cdot b \cdot \cos \theta)^2 > \frac{1}{2}a^2$, a count value of a count unit 204c is not reset. Only when the values of the sine signal and the cosine signal, which are mutually short-circuited, fall within $k \cdot b \cdot \cos \theta < 1/\sqrt{2}xa$ or $(k \cdot b \cdot \cos \theta)^2 < \frac{1}{4}a^2$ corresponding to a fault determinable region, the determination of fault and normal is permitted. When the values satisfy $(k \cdot b \cdot \sin \theta)^2 + (k \cdot b \cdot \cos \theta)^2 < \frac{1}{2}a^2$, the count value of the count unit 204c is gradually incremented. When the values satisfy $(k \cdot b \cdot \sin \theta)^2 + (k \cdot b \cdot \cos \theta)^2 > \frac{1}{2}a^2$, the count value of still another count unit 204c independent of the above malfunction case is reset.

The malfunction decision unit 206 configuring the malfunction detection unit 100h of the resolver determines decision of the malfunction when the count value is a given malfunction decision threshold value or more, on the basis of the count value of the count unit 204. The malfunction decision unit 206 then outputs a motor drive stop signal ST to the q-axis target current computation unit 100a.

Also, the malfunction detection unit 100h of the resolver determines normal when a state in which the count value of the count unit 204 is equal to lower than the malfunction decision threshold value continues for a given time. Then, the malfunction detection unit 100h resets the count unit 204 to 0 so as to reset the count of noise erroneously counted due to transient noise. As a result, malfunction or normal of the resolver can be detected with accuracy.

Also, the count unit 204 that gradually increments the count value with time when it is determined that the resolver is in malfunction is counted up only when malfunction continues at least plural times. With this operation, the count can be prevented from being erroneously counted due to transient noise in a short time, and the determination of fault or normal of the resolver can be detected with higher accuracy.

Subsequently, the operation of the resolver malfunction detection unit 100h will be described with reference to relationships of the operating waveforms of the respective components. FIGS. 6A to 6C are timing charts showing an example of the operation of the resolver malfunction detection unit when the above-mentioned malfunction detection device for the resolver disclosed in JP-A-9-72758 is in malfunction. FIG. 6A is a timing chart showing an example of a change in a value of a square sum, FIG. 6B is a timing chart showing a change in the count value when the value of the square sum changes as shown in FIG. 6A, and FIG. 6C is a timing chart showing a change in a resolver malfunction flag f_err when the count value changes as shown in FIG. 6B. The malfunction detection device for the resolver disclosed in JP-A-9-72758 includes a square sum calculator as the test value calculation unit, a malfunction detector as the malfunction detection unit, a counter as the count unit, and a malfunction decision unit as a malfunction decision means.

The square sum calculation unit calculates, as a test value, a value of a square sum that is a sum of a value obtained by squaring $\sin \theta$ represented by the sine signal and a value obtained by squaring $\cos \theta$ represented by the cosine signal. When the sine signal and the cosine signal are normal, the value of the square sum becomes a substantially constant value of a reference value (1) regardless of the rotation angle of the resolver, and the value of the square sum falls within a normal range between a given permissible upper value and a given permissible lower value. For example, when the resolver sine signal line is in a short-circuit fault at a time point A, the value of the square sum becomes the square value of the cosine signal because the sine signal is zero, and is changed between the reference value and zero according to the rotation angle of the resolver. When the rotation angular velocity of the resolver is high, a duration time of the permissible lower limit value or lower becomes short.

The malfunction detection unit determines whether the resolver is malfunction, or not, on the basis of the value of the square sum. In more detail, the malfunction detection unit determines whether the value of the square sum falls within the normal range between the given permissible upper limit value and the given permissible lower limit value, or not. When the value of the square sum falls outside the normal range, the malfunction detection unit determines that the resolver is in malfunction.

The counter gradually increments the count value with time when the malfunction detector determines that the resolver is in malfunction as shown in FIG. 6B. On the other, the counter resets the count value to zero when the malfunction detector determines that the resolver is out of malfunction. When the rotation angular velocity of the resolver is high, the duration time of the permissible lower limit value or lower is shortened. Therefore, even if malfunction is continued, the count value does not arrive at the given resolver malfunction determination threshold value or higher. The count value is reset to zero when the malfunction detector determines that the resolver is out of malfunction. When the rotation angular velocity of the resolver is low, the duration time of the permissible lower limit value or lower is lengthened. Therefore, malfunction is continued, and the count value arrives at the given resolver malfunction determination threshold value or higher.

As shown in FIG. 6C, the malfunction decision unit decides that the resolver is in malfunction under the condition in which the count value arrives at the given resolver malfunction determination threshold value or higher, and sets a resolver malfunction flag f_err to 1.

On the other hand, FIGS. 7A to 7C are timing charts showing an example of the operation of the resolver malfunction detection unit when the above-mentioned resolver sine signal line described in the embodiment of the present invention is in the short-circuit fault. FIG. 7A is a timing chart showing an example of a change in a value of a square sum, FIG. 7B is a timing chart showing a change in the count value when the value of the square sum changes as shown in FIG. 7A, and FIG. 7C is a timing chart showing a change in the resolver malfunction flag f_err when the count value changes as shown in FIG. 7B.

The square sum calculation unit 201 calculates, as a test value, a value of a square sum that is a sum of a value obtained by squaring $\sin \theta$ represented by the sine signal and a value obtained by squaring $\cos \theta$ represented by the cosine signal. When the sine signal and the cosine signal are normal, the value of the square sum becomes a substantially constant value of the reference value (1) regardless of the rotation angle of the resolver, and the value of the square sum falls within a normal range between the given permissible upper value and the given permissible lower value. For example, when the resolver sine signal line is in a short-circuit fault at the time point A, the value of the square sum becomes the square value of the cosine signal because the sine signal is zero, and is changed between the reference value and zero according to the rotation angle of the resolver. When the rotation angular velocity of the resolver is high, a duration time of the permissible lower limit value or lower becomes short.

When the resolver sine signal line is in the short-circuit fault, the malfunction detection unit 202 and the prohibition unit 203 read the sine signal and the cosine signal, and determines whether the malfunction determination of the resolver is prohibited, or not, according to read values of the sine signal and the cosine signal or a square value thereof. When the value of the cosine signal falls within $k \cdot b \cdot \cos \theta > 1/\sqrt{2} xa$ or $(k \cdot b \cdot \cos \theta)^2 > \frac{1}{2} a^2$ (normal state) corresponding to the outside of the fault determination region, the malfunction detection unit 202 and the prohibition unit 203 prohibit the determination of fault. When prohibition is not conducted, the malfunction detection unit 202 and the prohibition unit 203 determine whether the resolver is in malfunction, or not, on the basis of the value of the square sum. In more detail, the malfunction detection unit 202 and the prohibition unit 203 determine whether the value of square sum falls within the normal range between the given permissible upper limit value and the given permissible lower limit value, or not. When the value of the square sum falls outside the above normal range, the malfunction detection unit 202 and the prohibition unit 203 determine that the resolver is in malfunction.

The count unit 204 gradually increments the count value with time when the malfunction detection unit 202 determines that the resolver is in malfunction (when the value is equal to or lower than the permissible lower limit value), as shown in FIG. 7B (x in the figure). On the other hand, the count unit 204 holds the count value when the malfunction detection unit 202 determines that the malfunction determination of the resolver is prohibited (y in the figure). When the rotation angular velocity of the resolver is high, the duration time of the permissible lower limit value or lower becomes short. Therefore, even if malfunction is continued, the count value does not arrive at the given resolver malfunction determination threshold value or higher. When the malfunction detector determines that the malfunction determination of the resolver is prohibited, the count unit 204 holds the count value. Thereafter, when the malfunction detector determines that the resolver is in malfunction, and the count value arrives at the given resolver malfunction determination threshold value or higher, the count unit 204 maintains the count value at the malfunction determination value or higher.

As shown in FIG. 7C, the malfunction decision unit 206 decides that the resolver is in malfunction under the condition where the count value is equal to or higher than the given resolver malfunction determination threshold value, and sets the resolver malfunction flag f_err to 1.

FIGS. 8A to 8C are timing charts showing another example of the operation of the resolver malfunction detection unit 100h described in the embodiment of the present invention in the case where after the malfunction detection unit 100h of the resolver is in malfunction, the malfunction detection unit 100h is normally recovered in a short time.

The initial operation, for example, when the resolver sine signal line is in the short-circuit fault at the time point A is identical with that in FIGS. 7A to 7C, and a description thereof will be omitted.

For example, when the short-circuit fault of the resolver sine signal line is recovered to normal at a time point B, the value of the square sum becomes a substantially constant value of the reference value (1), and the value of the square sum is returned to the inside of the normal range between the given permissible upper limit value and the given permissible lower limit value. In this case, the malfunction detection unit 100h determines that the resolver is out of malfunction, and the reset unit 205 resets the count value to zero.

Figure 9:
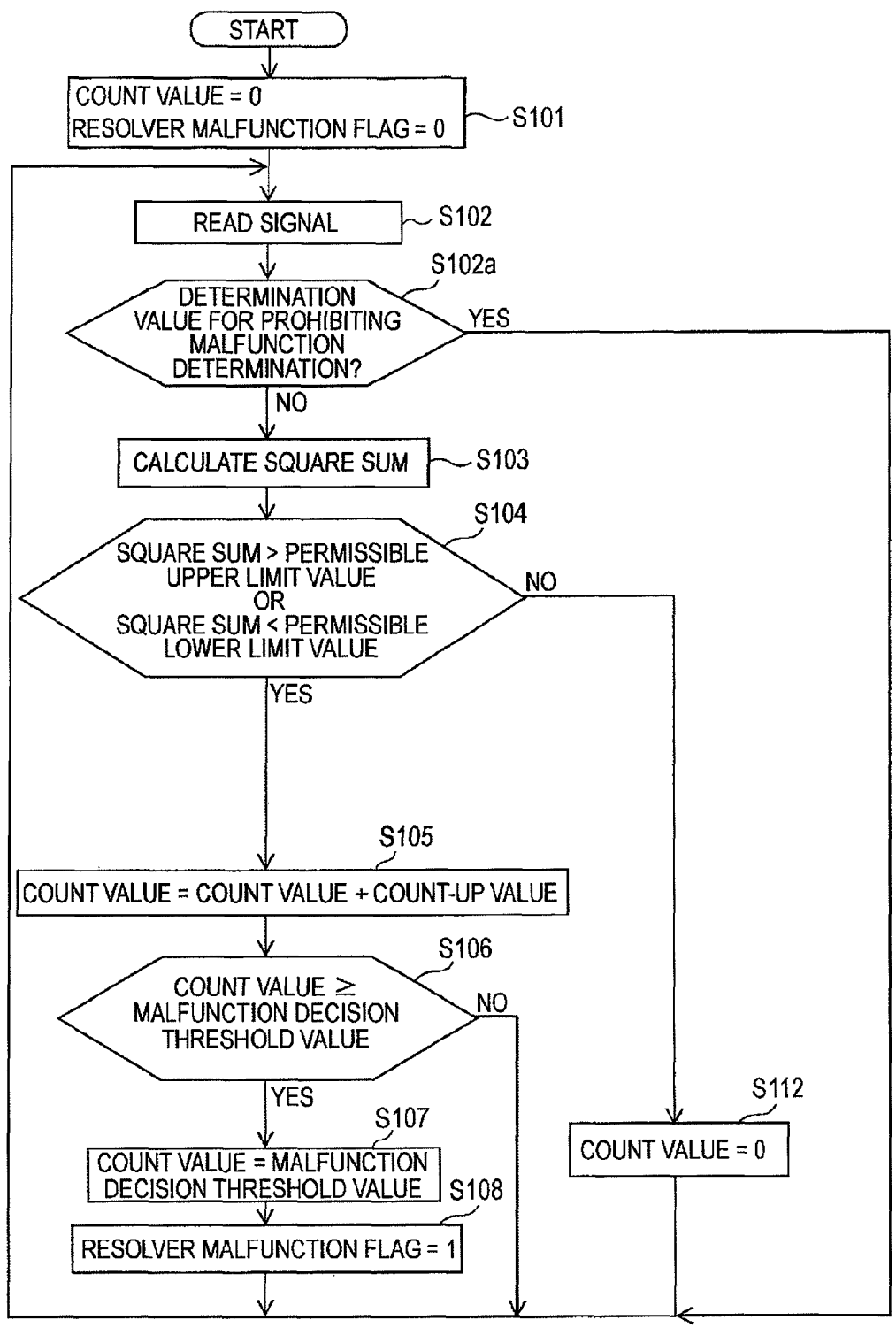
FIG. 9 is a flowchart showing processing of the resolver malfunction detection unit according to the first embodiment of the present invention.

The more specific processing operation of the malfunction detection unit 100h will be described with reference to a flowchart shown in FIG. 9.

First, as the initial setting, the count unit 204a for determination of short-circuiting of the resolver sine signal line, the count unit 204b for determination of short-circuiting of the resolver cosine signal line, and the count unit 204c for determination of mutual short-circuiting of the resolver sine signal line and the resolver cosine signal line set all of the count values to 0, and set the resolver malfunction flag f_err to 0 (Step S101).

Then, the sine signal and the cosine signal are read (Step S102), and it is determined whether malfunction determination of the resolver is prohibited, or not, according to the read values or the square values of the sine signal and the cosine signal (Step S102a).

First, a case in which the resolver sine signal line is in the short-circuit fault will be described. When the value of the cosine signal falls within $k \cdot b \cdot \cos\theta > 1/\sqrt{2}xa$ or $(k \cdot b \cdot \cos\theta)^2 > \frac{1}{2}a^2$ (normal state) corresponding to the outside of the fault determination region, the determination of fault is prohibited. When the determination of fault is not prohibited, the value of the square sum is calculated (Step S103). Then, it is determined whether at least one of a condition of (square sum)>(permissible upper limit value) and a condition of (square sum)<(permissible lower limit value) is satisfied, or not (Step S104). When it is determined that the malfunction determination of the resolver is prohibited in Step S102a, processing returns to Step S102.

In this embodiment, the value of the square sum, that is, 1 in a state where the resolver 9 is normal, is set as the reference value. In this case, an upper permissible difference, which is a difference between the reference value and the permissible upper limit value, and a lower permissible difference, which is a difference between the reference value and the permissible lower limit value, are set to be equal to each other (refer to FIG. 8).

When at least one of both the above conditions is satisfied, that is, when the value of the square sum is deviated from the normal range between the permissible upper limit value and the permissible lower limit value, a given count-up value is added to the count value of the count unit 204a (Step S105).

In addition, it is determined whether a condition of (count value)≥(malfunction decision threshold value) is satisfied, or not, in Step S106. As a result, when the above condition is satisfied, the malfunction decision threshold value is assigned to the count value of the counter 1 (Step S107), and the resolver malfunction flag f_err is set to 1, and processing is returned to Step S102 (Step S108). When the condition in Step S106 is not satisfied, processing is returned to Step S102a.

On the other hand, when none of both the above conditions is satisfied in Step S104, that is, when the value of the square sum falls within the normal range between the permissible upper limit value and the permissible lower limit value, processing is advanced to Step S112. In Step S112, the count value 0 is assigned to the count value of the appropriate fault counter 1, and processing is then returned to Step S102a. That is, when the value of the square sum is deviated from the normal range between the permissible upper limit value and the permissible lower limit value, the count-up value is added to the count value for each given period to gradually increment the count value. On the other hand, when the value of the square sum falls within the normal range between the permissible upper limit value and the permissible lower limit value, the count value is cleared to 0 by the reset unit 205.

A case in which the resolver cosine signal line is in the short-circuit fault will be described with reference to a flowchart of FIG. 9. In this case, the initial setting and the signal read operation are the same as those when the resolver sine signal line is short-circuited. When the value of the sine signal falls within $k \cdot b \cdot \sin\theta > 1/\sqrt{2}xa$ or $(k \cdot b \cdot \sin\theta)^2 > \frac{1}{2}a^2$ (normal state) corresponding to the outside of the fault determination region, the determination of fault is prohibited. When the determination of fault is not prohibited, the value of the square sum is calculated (Step S103). In addition, it is determined whether at least one of a condition of (square sum)>(permissible upper limit value) and a condition of (square sum)<(permissible lower limit value) is satisfied, or not (Step S104). When it is determined that the malfunction determination of the resolver is prohibited in Step S102a, processing returns to Step S102.

Then, in Step S104, when at least one of both the above conditions is satisfied, that is, when the value of the square sum is deviated from the normal range between the permissible upper limit value and the permissible lower limit value, a given count-up value is added to the count value of a counter 2 (Step S105).

Then, it is determined whether a condition of (count value)≥(malfunction decision threshold value) is satisfied, or not, in Step S106. As a result, when the condition is satisfied, the malfunction decision threshold value is assigned to the count value of the count unit 204b (Step S107), the resolver malfunction flag f_err is set to 1, and processing returns to Step S102 (Step S108). When the condition is not satisfied in Step S106, processing returns to Step S102.

On the other hand, when none of both the above conditions is satisfied in Step S104, that is, when the value of the square sum falls within the normal range between the permissible upper limit value and the permissible lower limit value, processing is advanced to Step S112. In Step S112, 0 is assigned to the count value of the appropriate malfunction count unit 204b, and processing is then returned to Step S102. That is, when the value of the square sum is deviated from the normal range between the permissible upper limit value and the permissible lower limit value, the count-up value is added to the count value for each given period to gradually increment the count value. On the other hand, when the value of the square sum falls within the normal range between the permissible upper limit value and the permissible lower limit value, the count value is cleared to 0.

The same is applied to a case in which the resolver sine signal line and the resolver cosine signal line are in the short-circuit fault, and only a method of determining whether the malfunction determination of the resolver is prohibited in Step S102a is different therebetween.

That is, after the respective signals have been read (Step S102), when the respective values of the sine signal and the cosine signal are substantially identical with each other, and fall within $k \cdot b \cdot \cos\theta > 1/\sqrt{2}xa$ or $(k \cdot b \cdot \cos\theta)^2 > \frac{1}{4}a^2$, or $k \cdot b \cdot \sin\theta > 1/\sqrt{2}xa$ or $(k \cdot b \cdot \sin\theta)^2 > \frac{1}{4}a^2$ (normal state), corresponding to the outside of the fault determination region, the determination of fault is prohibited. When the determination of fault is not prohibited, the value of the square sum is calculated (Step S103). The subsequent Steps S104 to S108, and S112 are perfectly identical with those in the above case, and a description thereof will be omitted.

As described above, in the above embodiment, when the resolver is in malfunction, the sine signal and the cosine signal are read, and it is determined whether the malfunction determination of the resolver is prohibited, or not, according to the read values or the square values of the sine signal and the cosine signal. When it is determined that the malfunction determination of the resolver is prohibited, the count value is accumulated and incremented every time the test value falls outside of the normal range. When the count value arrives at a given value or higher, it is determined that the resolver is in malfunction. As a result, the present invention is free from a case in which the test value is varied between inside and outside of the above normal range according to the rotation angle θ of the rotating body, with the results that a state in which the value falls outside the normal range is not continued, and the malfunction is not detected even if malfunction occurs in the resolver, as in the conventional art.

However, even if the resolver is normal, the test value may temporarily fall outside the normal range, for example, due to an influence of noise. Therefore, the count value is accumulated and incremented every time the test value falls outside of the normal range. As a result, the count value exceeds the given value, and the normal resolver may be determined as fault.

On the contrary, in this embodiment, even if the value of the square sum falls outside the normal range, it is determined whether the resolver is normal or in malfunction on the basis of at least one of the sine signal and the cosine signal. Except for a case in which it can be determined that the resolver is in malfunction determination of whether the resolver is in malfunction, or not, based on the test value is not conducted, and the count value is accumulated and incremented. On the other hand, when it can be determined that the resolver is in malfunction, the determination of fault and normal is conducted without error according to the test value. Even if the resolver 9 is in malfunction, and the value of the square sum is varied between inside and outside of the normal range, the malfunction can be surely detected.

Accordingly, in the case where the value of the square sum temporarily falls outside the normal range due to, for example, an influence of noise, and the count value is incremented, the count value is reset when the value of the square sum falls within the normal range. Therefore, the normal resolver 9 can be prevented from being determined as fault. Therefore, according to this embodiment, the malfunction of the resolver 9 can be detected with accuracy.

Second Embodiment

In the above first embodiment, a determination value 2 of a fault determinable region at the time of the fault in which the resolver sine signal line and the resolver cosine signal line are mutually short-circuited is narrower in range than a determination value 1 of a fault determinable region when the resolver sine signal line or the resolver cosine signal line is in the short-circuit fault, independently. Therefore, when those values are unified into the same determination value by sharing the count unit $204a$ for determination of short-circuiting of the resolver sine signal line, or the count unit $204b$ for determination of short-circuiting of the resolver cosine signal line, the determination value 2 of the narrower fault determinable region is used. As a result, the fault determinable region is narrowed.

The second embodiment is made to solve the above problem. A case in which the resolver sine signal and the resolver cosine signal are in the short-circuit fault, respectively, and a case of fault in which the resolver sine signal and the resolver cosine signal are mutually short-circuited are discriminated from the relative values of the resolver sine signal and the resolver cosine signal. A case in which a ratio of the relative values of the resolver sine signal and the resolver cosine signal is larger than 1:3 is set to a determination value 1 of a fault determinable region where the resolver sine signal line and the resolver cosine signal line are in the short-circuit fault, independently. A case in which the ratio of the relative values of the resolver sine signal and the resolver cosine signal is smaller than 1:3 is set to a determination value 2 of a fault determinable region at the time of fault in which the resolver sine signal line and the resolver cosine signal line are mutually short-circuited.

Figure 10:
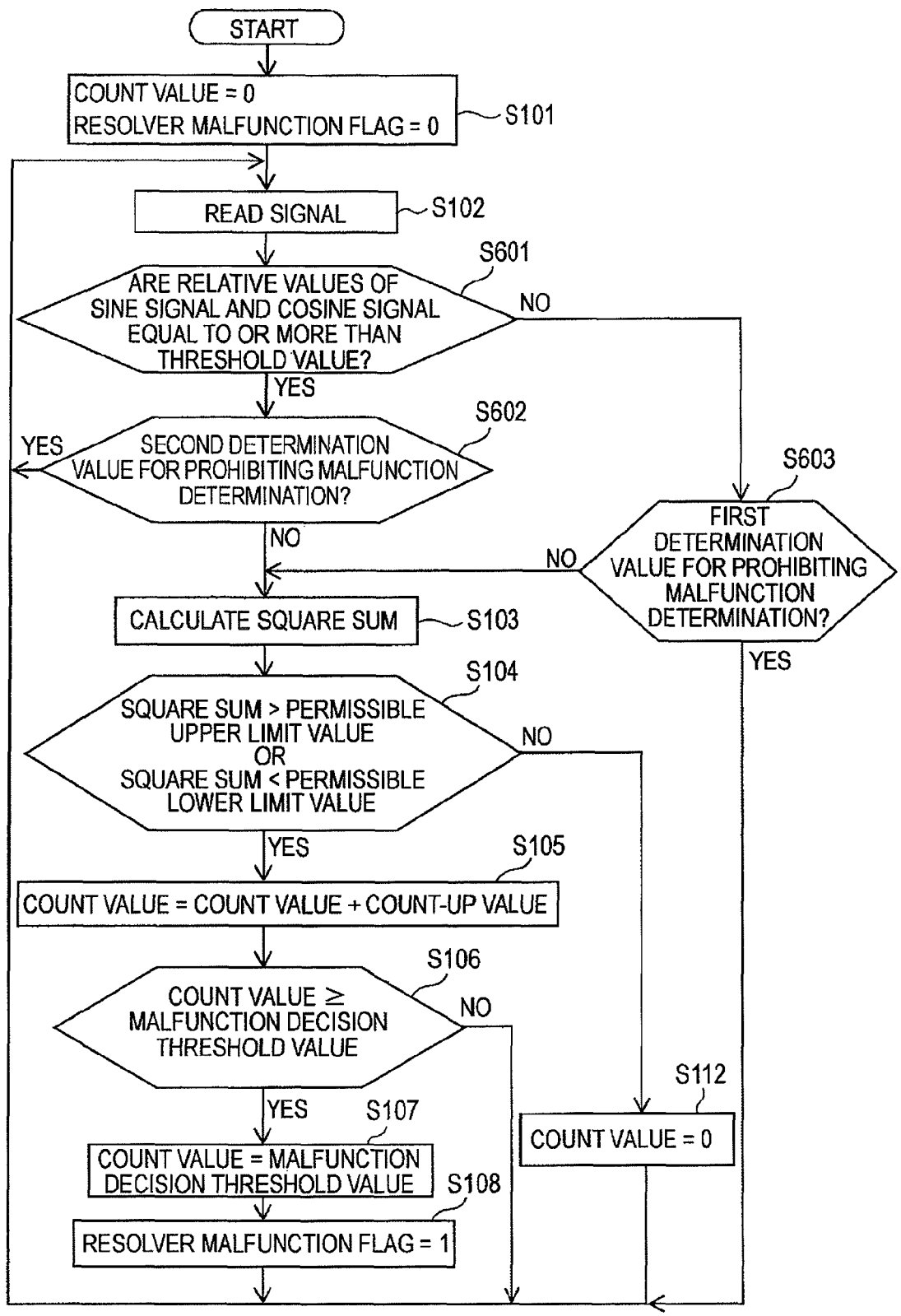
FIG. 10 is a flowchart showing processing of a resolver malfunction detection unit according to a second embodiment of the present invention.

FIG. 10 is a flowchart showing processing of a resolver malfunction detection unit according to a second embodiment of the present invention.

First, as an initial setting, count values of all fault counters are set to 0, and the resolver malfunction flag f_err is set to 0 (Step S101) as in the first embodiment.

Then, the sine signal and the cosine signal are read (Step S102), and the relative values of the values of the sine signal and the cosine signal are calculated. When it is determined that the amplitude of the sine signal is $|COS|>3|SIN|$ which is sufficiently smaller than the amplitude of the cosine signal (Step S601), it is determined that the resolver sine signal line is in the short-circuit fault, and processing is advanced to Step S602.

Also, when it is determined that the amplitude of the sine signal is not sufficiently smaller than the amplitude of the cosine signal (Step S601), it is determined that the sine signal line and the cosine signal line are mutually short-circuited, and processing is advanced to Step S603.

Likewise, the relative values of the values of the sine signal and the cosine signal are calculated. When it is determined that the amplitude of the sine signal is $|SIN|>3|COS|$ which is sufficiently smaller than the amplitude of the cosine signal (Step S601), it is determined that the resolver cosine signal line is in the short-circuit fault, and processing is advanced to Step S602. Also, when it is determined that the amplitude of the sine signal is not sufficiently smaller than the amplitude of the cosine signal (Step S601), it is determined that the sine signal line and the cosine signal line are mutually short-circuited, and processing is advanced to Step S603.

Then, it is determined whether the malfunction determination of the resolver when the sine signal line or the cosine signal line is in the short-circuit fault, independently, is prohibited, or not, from the read values or the square values of the sine signal and the cosine signal (Step S602).

In the case where the resolver sine signal line is in the short-circuit fault, when the value of the cosine signal falls within $k \cdot b \cdot \cos \theta > 1/\sqrt{2}xa$ or $(k \cdot b \cdot \cos \theta)^2 > \frac{1}{2}a^2$ (normal state), corresponding to the outside of the fault determination region, the determination of fault is prohibited. When the determination of fault is not prohibited, the value of the square sum is calculated (Step S103).

Then, it is determined whether at least one of a condition of (square sum)>(permissible upper limit value) and a condition of (square sum)<(permissible lower limit value) is satisfied, or not (Step S104). When it is determined that the malfunction determination of the resolver is prohibited in Step S602, processing returns to Step S102.

Likewise, in the case where the resolver cosine signal line is in the short-circuit fault, when the value of the sine signal falls within $k \cdot b \cdot \sin \theta > 1/\sqrt{2}xa$ or $(k \cdot b \cdot \sin \theta)^2 > \frac{1}{2}a^2$ (normal state), corresponding to the outside of the fault determination region, the determination of fault is prohibited. When the determination of fault is not prohibited, the value of the square sum is calculated (Step S103). Then, it is determined whether at least one of a condition of (square sum)>(permissible upper limit value) and a condition of (square sum)<(permissible lower limit value) is satisfied, or not (Step S104). When it is determined that the malfunction determination of the resolver is prohibited in Step S602, processing is returned to Step S102.

Then, in the case of fault in which the sine signal line and the cosine signal line are mutually short-circuited, when the respective values of the sine signal and the cosine signal fall within $k \cdot b \cdot \cos \theta > \frac{1}{2}xa$ or $(k \cdot b \cdot \cos \theta)^2 > \frac{1}{4}a^2$, or $k \cdot b \cdot \sin \theta > \frac{1}{2}xa$ or $(k \cdot b \cdot \sin \theta)^2 > \frac{1}{4}a^2$ (normal state), corresponding to the outside of the fault determination region, the determination of fault is prohibited. When the determination of fault is not prohibited, the value of the square sum is calculated (Step S103). Then, it is determined whether at least one of a condition of (square sum)>(permissible upper limit value) and a condition of (square sum)<(permissible lower limit value) is satisfied, or not (Step S104). When it is determined that the malfunction determination of the resolver is prohibited in Step S102a, processing is returned to Step S102.

In this embodiment, when the value of the square sum in a state where the resolver 9 is normal, that is, 1 is set to a reference value, the upper permissible difference that is a difference between the reference value and the permissible upper limit value, and the lower permissible difference that is a difference between the reference value and the permissible lower limit value are set to be equal to each other as in the above-mentioned embodiment. Then, in Step S104, when at least one of both the above conditions is satisfied, that is, when the value of the square sum is deviated from the normal range between the permissible upper limit value and the permissible lower limit value, a given count-up value is added to the count value of an appropriate fault counter (Step S105).

Then, in Step S106, it is determined whether a condition of (count value)≥(malfunction decision threshold value) is satisfied, or not. As a result, when the condition is satisfied, the malfunction decision threshold value is assigned to the count value of the appropriate fault counter (Step S107), the resolver malfunction flag f_err is set to 1, and processing is returned to Step S102 (Step S108). When the condition is not satisfied in Step S106, processing is returned to Step S102.

On the other hand, when none of both the above conditions is satisfied in Step S104, that is, when the value of the square sum falls within the normal range between the permissible upper limit value and the permissible lower limit value, processing is advanced to Step S112. In Step S112, 0 is assigned to the count value of the appropriate fault counter, and processing is then returned to Step S102.

That is, when the value of the square sum is deviated from the normal range between the permissible upper limit value and the permissible lower limit value, the count-up value is added to the count value for each given period, and the count value is gradually incremented. On the other hand, when the square sum falls within the normal range between the permissible upper limit value and the permissible lower limit value, the count value is cleared to 0.

As described above, in the second embodiment, there is provided a unit for computing the relative values of the values of the sine signal and the cosine signal, determining the malfunction mode from the relative values, and appropriately changing the determination value of the malfunction detection unit according to the malfunction mode for prohibition. A determination value 1 of a fault determinable region when the resolver sine signal line or the resolver cosine signal line is in the short-circuit fault, independently, and a determination value 2 of a fault determinable region at the time of the fault in which the resolver sine signal line and the resolver cosine signal line are mutually short-circuited is unified into the same determination value. In this situation, a case in which the resolver sine signal and the resolver cosine signal are in the short-circuit fault, respectively, and a case of fault in which the resolver sine signal line and the resolver cosine signal line are mutually short-circuited are discriminated from the relative values of the resolver sine signal and the resolver cosine signal. A case in which a ratio of the relative values of the resolver sine signal and the resolver cosine signal is larger than 1:3 is set to a determination value 1 of a fault determinable region where the resolver sine signal line and the resolver cosine signal line are in the short-circuit fault, independently. A case in which the ratio of the respective relative values is smaller than 1:3 is set to a determination value 2 of a fault determinable region at the time of fault in which the resolver sine signal line and the resolver cosine signal line are mutually short-circuited. As a result, the malfunction or normal of the resolver can be detected with accuracy while solving the drawback that the fault determinable region is narrowed.

In the above embodiment, the determination value of malfunction is set to $\frac{1}{2}a^2$ or lower. However, it can be expected that the same advantages are obtained even when $\frac{1}{2}a^2$ or lower, or $\frac{3}{2}a^2$ or higher is determined as fault, and other ranges are determined as normal.

Third Embodiment

Figure 11:
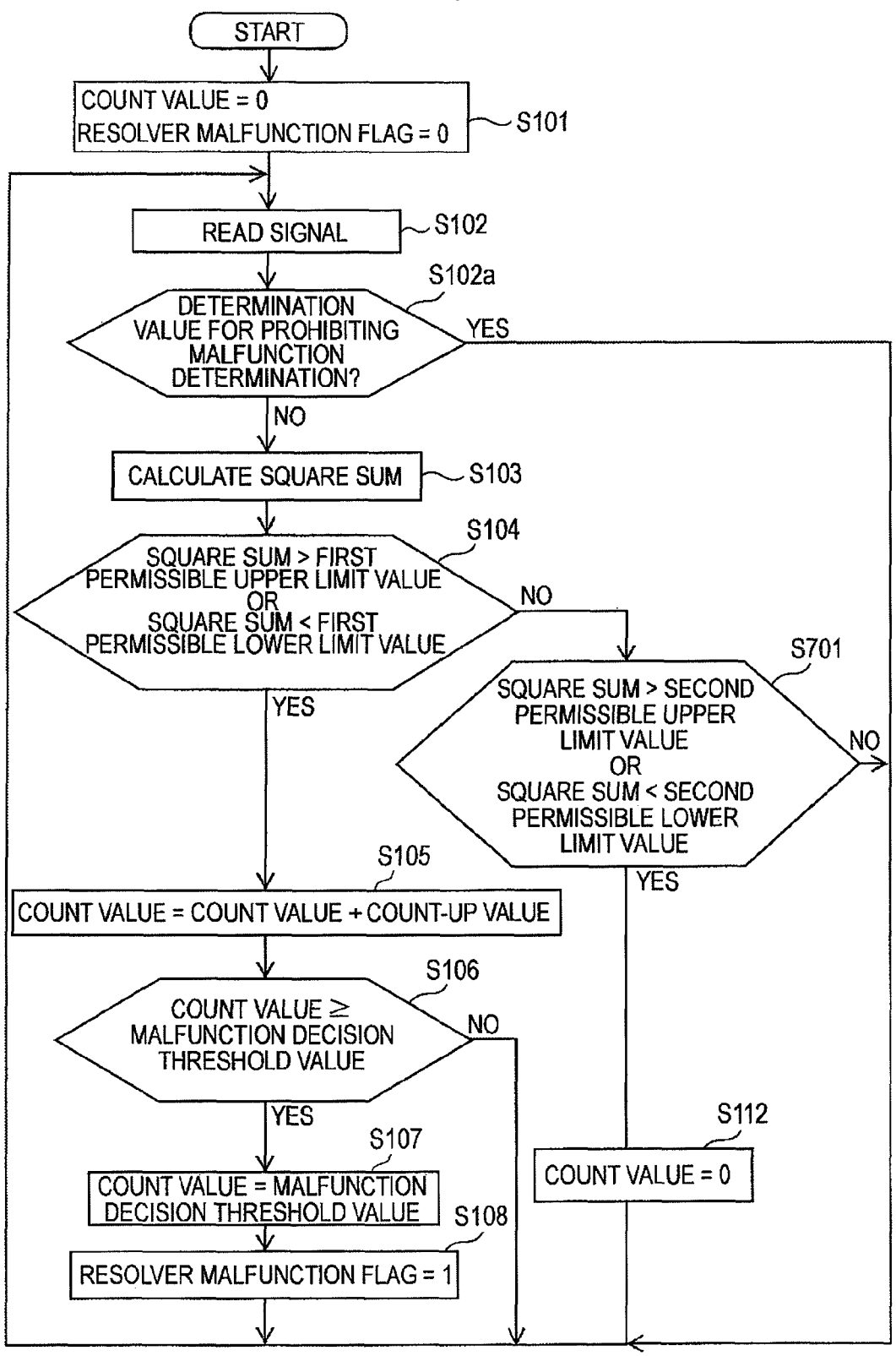
FIG. 11 is a flowchart showing processing of a resolver malfunction detection unit according to a third embodiment of the present invention.

FIG. 11 is a flowchart showing processing of a resolver malfunction detection unit according to a third embodiment of the present invention. The initial setting (Step S101), reading of the sine signal and the cosine signal (Step S102), determination of whether the malfunction determination of the resolver is prohibited, or not, from the read values or the square values of the sine signal and the cosine signal (Step S102a), and the subsequent steps S103 to S112 are identical with those in FIG. 9. Therefore, a description thereof will be omitted, and only different portions will be described.

In the case where the resolver sine signal line is in the short-circuit fault, when the value of the cosine signal falls within $k \cdot b \cdot \cos \theta > 1/\sqrt{2}xa$ or $(k \cdot b \cdot \cos \theta)^2 > \frac{1}{2}a^2$ (normal state), corresponding to the outside of the fault determination region, the determination of fault is prohibited. When the determination of fault is not prohibited, the value of the square sum is calculated (Step S103).

Then, it is determined whether at least one of a condition (square sum)>(first permissible upper limit value) and a condition of (square sum)<(first permissible lower limit value) is satisfied, or not (Step S104). More specifically, when $(k \cdot b \cdot \sin \theta)^2 + (k \cdot b \cdot \cos \theta)^2 < \frac{1}{2}a^2$ is satisfied, or when $(k \cdot b \cdot \sin \theta)^2 + (k \cdot b \cdot \cos \theta)^2 > \frac{3}{2}a^2$ is satisfied, processing is advanced to Step S105. When it is determined that the malfunction determination of the resolver is prohibited in Step S102a, processing returns to Step S102.

Then, in Step S104, when at least one of both the above conditions is satisfied, that is, when the value of the square sum is deviated from the normal range between the first permissible upper limit value and the first permissible lower limit value, a given count-up value is added to the count value of an appropriate fault counter (Step S105). On the other hand, in Step S104, when none of both the above conditions is satisfied, that is, when the value of the square sum falls within the normal range between the permissible upper limit value and the permissible lower limit value, processing is advanced to Step S701.

Then, it is determined whether a condition of (square sum)<(second permissible upper limit value) and a condition of (square sum)<(second permissible lower limit value) are satisfied, or not, with the use of the determination value of a second permissible upper limit value or a second permissible lower limit value which is different from the first permissible upper limit value or the first permissible lower limit value (Step S701). More specifically, a case in which $(k \cdot b \cdot \sin \theta)^2 + (k \cdot b \cdot \cos \theta)^2 > \frac{1}{2}a^2 + K1$ is satisfied, or a case in which $(k \cdot b \cdot \sin \theta)^2 + k \cdot b \cdot \cos \theta)^2 < \frac{3}{2}a^2 - K2$ is satisfied, is determined as no malfunction (normal), and processing is advanced to Step S112. In Step S112, 0 is assigned to the count value of the appropriate fault counter, and processing is then advanced to Step S102.

In Step S701, when it is determined that the malfunction determination of the resolver is prohibited without satisfying the above determination, processing is advanced to Step S102 with doing nothing.

That is, when the value of the square sum is deviated from the normal range between the first permissible upper limit value and the first permissible lower limit value, the count-up value is added to the count value of the appropriate fault counter for each given period to gradually increment the count value. On the other hand, the square sum gives the determination value hysteresis, different from the determination value of the normal range. When the determination value as fault is a determination value different from the determination value as no malfunction, that is, when the square sum more surely falls within the normal range between the second permissible upper limit value and the second permissible lower limit value, the count value of the appropriate fault counter is cleared to 0.

A case in which the resolver sine signal line is in the short-circuit fault is described. It can be expected that the same advantage is applied to a case in which the resolver cosine signal line is in the short-circuit fault, and a case of fault in which the resolver sine signal line and the resolver cosine signal line are mutually short-circuited.

Accordingly, in the above-mentioned malfunction detection device for a resolver according to the third embodiment of the present invention, when the resolver is in malfunction, the test value is varied between inside and outside of the normal range according to the rotation angle θ of the rotating body. As a result, a state in which the value falls outside the normal range is not continued, and even if the resolver is in malfunction, the malfunction resolver is detected without any error with more accuracy. Then, for example, even if the value of the square sum is temporarily varied by an influence of noise, erroneous determination can be prevented. Therefore, according to this embodiment, the malfunction of the resolver 9 can be detected with more accuracy.

Fourth Embodiment

Figure 12:
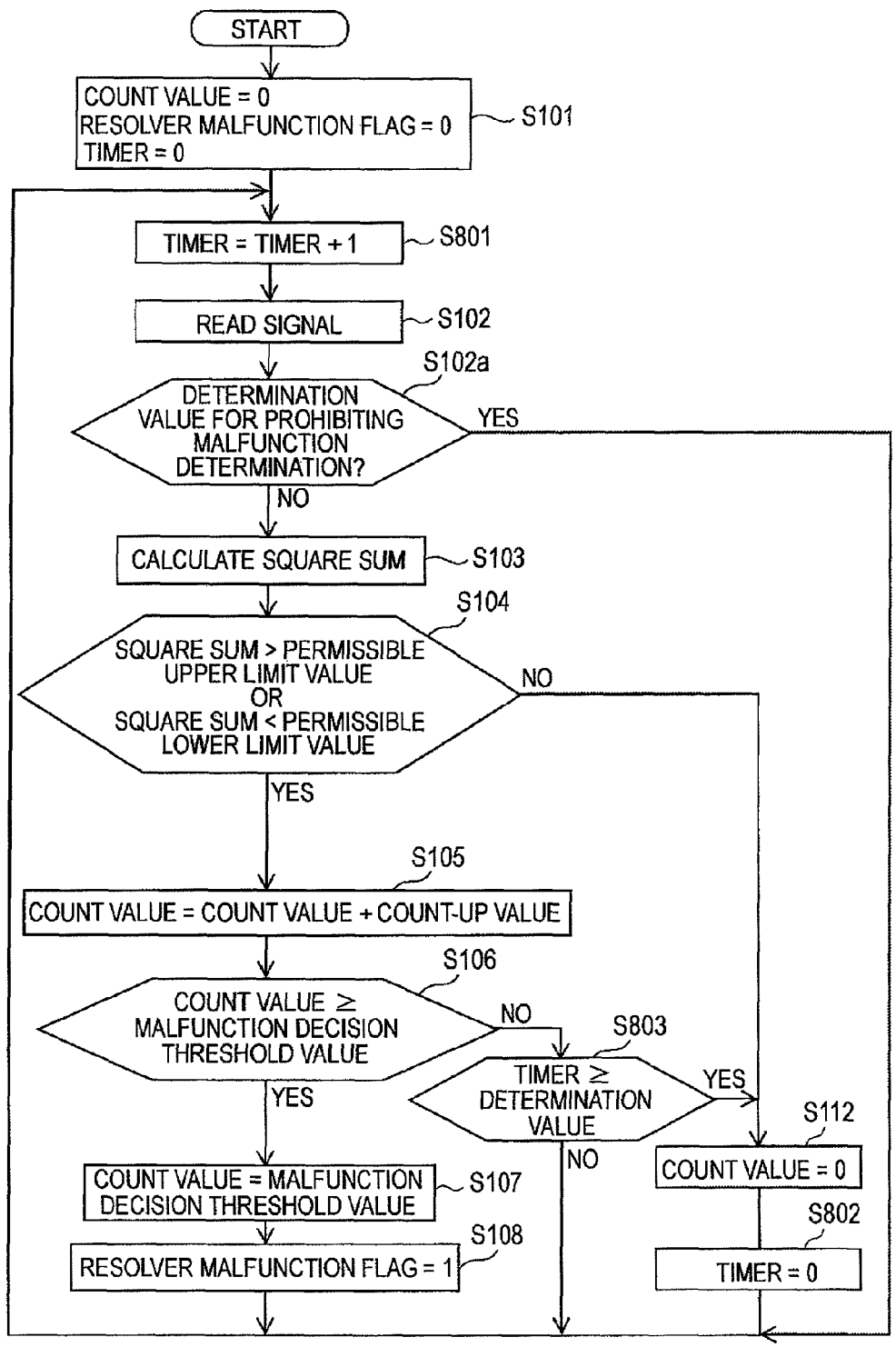
FIG. 12 is a flowchart showing processing of a resolver malfunction detection unit according to a fourth embodiment of the present invention.

FIG. 12 is a flowchart showing processing of a resolver malfunction detection unit according to a fourth embodiment of the present invention.

The resolver malfunction detection unit 100h first sets the count value to 0 as the initial setting, sets the resolver malfunction flag f_err to 0, and sets the timer to 0 of an initial value (Step S101).

Then, the timer is counted up by 1 (Step S801), the sine signal and the cosine signal are read (Step S102), and it is determined whether the malfunction determination of the resolver is prohibited, or not, from the read values or the square values of the sine signal and the cosine signal (Step S102a). In the case where the resolver sine signal line is in the short-circuit fault, when the value of the cosine signal falls within $k \cdot b \cdot \cos \theta > 1/\sqrt{2}xa$ or $(k \cdot b \cdot \cos \theta)^2 > \frac{1}{2}a^2$ (normal state), corresponding to the outside of the fault determination region, the determination of fault is prohibited. When the determination of fault is not prohibited, the value of the square sum is calculated (Step S103). Then, it is determined whether at least one of a condition of (square sum)>(permissible upper limit value) and a condition of (square sum)< (permissible lower limit value) is satisfied, or not (Step S104). When it is determined that the malfunction determination of the resolver is prohibited in Step S102a, processing returns to Step S801.

Likewise, in the case where the resolver cosine signal line is in the short-circuit fault, when the value of the sine signal falls within $k \cdot b \cdot \sin \theta > 1/\sqrt{2}xa$ or $(k \cdot b \cdot \sin \theta)^2 > \frac{1}{2}a^2$ (normal state), corresponding to the outside of the fault determination region, the determination of fault is prohibited. When the determination of fault is not prohibited, the value of the square sum is calculated (Step S103). Then, it is determined whether at least one of a condition of (square sum)>(permissible upper limit value) and a condition of (square sum)< (permissible lower limit value) is satisfied, or not (Step S104). When it is determined that the malfunction determination of the resolver is prohibited in Step S102a, processing returns to Step S102.

Then, in Step S104, when at least one of both the above conditions is satisfied, that is, when the value of the square sum is deviated from the normal range between the permissible upper limit value and the permissible lower limit value, a given count-up value is added to the count value of an appropriate fault counter (Step S105). Then, in Step S106, it is determined whether a condition of (count value)≥(malfunction decision threshold value) is satisfied, or not. As a result, when the condition is satisfied, the malfunction decision threshold value is assigned to the count value of the appropriate fault counter (Step S107) the resolver malfunction flag f_err is set to 1, and processing is returned to Step S102 (Step S108). When the condition is not satisfied in Step S106, processing is returned to Step S102.

On the other hand, when none of both the above conditions is satisfied in Step S104, that is, when the value of the square sum falls within the normal range between the permissible upper limit value and the permissible lower limit value, processing is advanced to Step S803. It is determined whether the timer arrives at the determination value, or not, that is, an integrated value of times during which the fault counter does not reach the malfunction decision threshold value arrives at the determination value or higher, or not. When the timer does not arrive at the determination value, processing is advanced to Step S801 with doing nothing. When the timer arrives at the determination value, processing is advanced to Step S112. In Step S112, 0 is assigned to the count values of all the fault counters in Step S112, 0 is assigned to the timer in Step S802, and processing is then returned to Step S801.

That is, when the value of the square sum is deviated from the normal range between the permissible upper limit value and the permissible lower limit value, the count-up value is added to the count value of the appropriate fault counter for each given period, and the count value is gradually incremented. At the same time, a time during which the malfunction counter, after it is determined that the value of the square sum falls within the previous normal range, is gradually incremented or held by the timer, is measured by the timer. On the other hand, when the square sum falls within the normal range between the permissible upper limit value and the permissible lower limit value, the count value of the appropriate fault counter and the timer are cleared to 0.

Further, the timer that measures a time, during which the malfunction counter is gradually incremented or held, arrives at the determination value which is determined as a sufficiently long time until the malfunction counter arrives at the malfunction determination threshold value. In this case, the count values of all the counters and the timer are cleared to 0. Therefore, even if the resolver is normal, the test value is temporarily deviated from the normal range, for example, by an influence of noise. That the count value of the malfunction counter is accumulated and increased each time is reset each given time, and the false detection of malfunction is prevented. Therefore, according to this embodiment, the malfunction of the resolver 9 can be detected with more accuracy.

Fifth Embodiment

Figure 13:
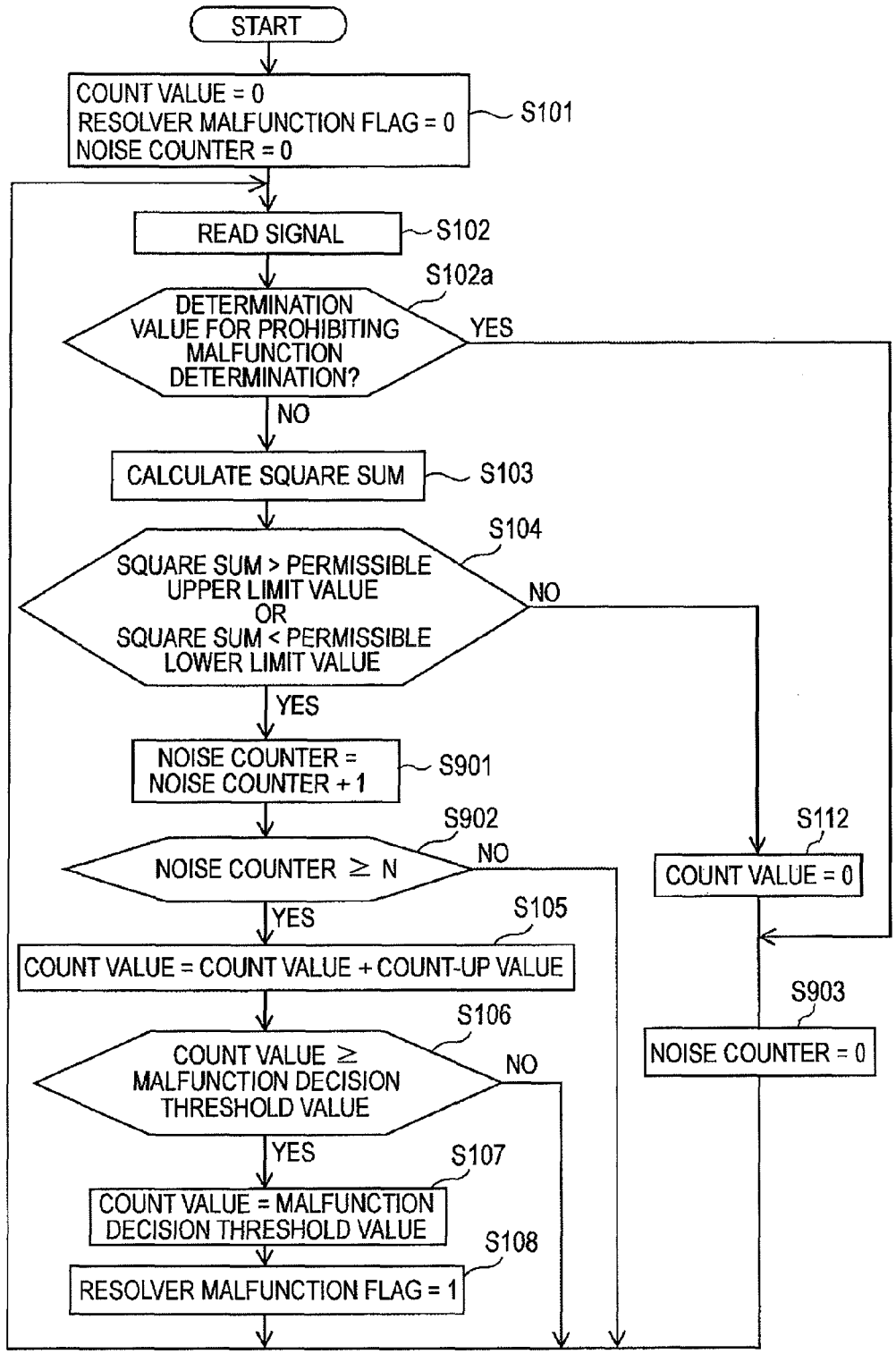
FIG. 13 is a flowchart showing processing of a resolver malfunction detection unit according to a fifth embodiment of the present invention.

FIG. 13 is a flowchart showing processing of a resolver malfunction detection unit according to a fifth embodiment of the present invention. Hereinafter, a description will be given sequentially with reference to FIG. 13.

First, as the initial setting, the count value is set to 0, the resolver malfunction flag f_err is set to 0, and the noise counter is set to the initial value 0 (Step S101).

Then, the sine signal and the cosine signal are read (Step S102), and it is determined whether malfunction determination of the resolver is prohibited, or not, according to the read values or the square values of the sine signal and the cosine signal (Step S102a).

In the case where the resolver sine signal line is in the short-circuit fault, when the value of the cosine signal falls within $k \cdot b \cdot \cos \theta > 1/\sqrt{2} xa$ or $(k \cdot b \cdot \cos \theta)^2 > \frac{1}{2} a^2$ (normal state), corresponding to the outside of the fault determination region, the determination of fault is prohibited. When the determination of fault is not prohibited, the value of the square sum is calculated (Step S103).

Then, it is determined whether at least one of a condition of (square sum)>(permissible upper limit value) and a condition of (square sum)<(permissible lower limit value) is satisfied, or not (Step S104). When it is determined that the malfunction determination of the resolver is prohibited in Step S102a, the noise counter is reset to 0 in Step S903, and processing is returned to Step S102.

Likewise, in the case where the resolver cosine signal line is in the short-circuit fault, when the value of the sine signal falls within $k \cdot b \cdot \sin \theta > 1/\sqrt{2} xa$ or $(k \cdot b \cdot \sin \theta)^2 > \frac{1}{2} a^2$ (normal state), corresponding to the outside of the fault determination region, the determination of fault is prohibited. When the determination of fault is not prohibited, the value of the square sum is calculated (Step S103). Then, it is determined whether at least one of a condition of (square sum)>(permissible upper limit value) and a condition of (square sum)< (permissible lower limit value) is satisfied, or not (Step S104). When it is determined that the malfunction determination of the resolver is prohibited in Step S102a, the noise counter is reset to 0 in S903, and processing returns to Step S102.

Then, in Step S104, when at least one of both the above conditions is satisfied, that is, when the value of the square sum is deviated from the normal range between the permissible upper limit value and the permissible lower limit value, the noise counter is counted up in Step S901. Then, in Step S902, it is determined whether the noise counter arrives at a specific value N, or not. When the noise counter arrives at the specific value N, a given count-up value is added to the count value (Step S105).

Then, it is determined whether a condition of (count value)≥(malfunction decision threshold value) is satisfied, or not, in Step S106. As a result, when the condition is satisfied, the malfunction decision threshold value is assigned to the count value (Step S107), the resolver malfunction flag f_err is set to 1, and processing is returned to Step S102 (Step S108). When the condition is not satisfied in Step S106, processing is returned to Step S102.

On the other hand, when none of both the above conditions is satisfied in Step S104, that is, when the value of the square sum falls within the normal range between the permissible upper limit value and the permissible lower limit value, processing is advanced to Step S112. 0 is assigned to the count values in Step S112, 0 is assigned to the noise counter in Step S903, and processing is then returned to Step S102.

That is, in the case where the value of the square sum is in a malfunction state, which is deviated from the normal range between the permissible upper limit value and the permissible lower limit value, only when the malfunction state is continued at least plural times with respect to count values, the count-up value is added for each given period, and the count value is gradually incremented.

Therefore, according to the resolver malfunction detection unit of the fifth embodiment, there is provided a unit counts up the count of the count unit, which gradually increments the count value with time when the malfunction detection unit determines that the resolver is in malfunction, only when malfunction is continued at least plural times. With this configuration, the count can be prevented from being erroneously counted due to transient noise in a short time, and the determination of fault or normal of the resolver can be detected with higher accuracy.

The count unit described in the above first to fifth embodiments gradually increments the count value. However, the same advantages can be expected in a count unit that gradually decrements the counter and a malfunction decision threshold value corresponding thereto.

Various modifications and alterations of this invention will be apparent to those skilled in the art without departing from the scope and spirit of this invention, and it should be understood that this is not limited to the illustrative embodiments set forth herein.

What is claimed is:

1. A malfunction detection device which is attached to and detects a malfunction in a resolver that outputs a sine signal representative of $\sin \theta$ and a cosine signal representative of $\cos \theta$ according to a rotation angle $\theta$ of a rotating body, the malfunction detection device comprising:
   a test value calculator configured to calculate a test value on the basis of at least one of the sine signal and the cosine signal;
   a malfunction detector configured to detect a malfunction in the resolver according to whether or not the test value falls within a normal range;
   a prohibitor configured to prohibit determining the malfunction and a normal function of the resolver in response to the cosine signal falling within a normal state range when a sine signal line of the resolve is in a short-circuit fault;
   a counter configured to increase a count value when the malfunction detector detects that the resolver is malfunctioning and maintain the increased count value in response to the prohibitor prohibiting the determination of the malfunction;
   a resetter configured to reset the count value when the malfunction detector detects that the resolver is not malfunctioning; and
   a malfunction decider configured to decide that the resolver is malfunctioning when the count value is equal to or higher than a malfunction decision threshold value.

2. The malfunction detection device according to claim 1, wherein the prohibitor prohibits the malfunction detector from performing detection according to a value of the sine signal relative to a given value.

3. The malfunction detection device according to claim 2, further comprising:
   a unit that changes the given value according to relative values of the sine signal value and the cosine signal value; and a unit that prohibits the malfunction detector from performing detection according to the changed given value.

4. The malfunction detection device according to claim 1, wherein the prohibitor prohibits the malfunction detector from performing detection according to a square value of the sine signal relative to a given value.

5. The malfunction detection device according to claim 1, wherein the prohibitor prohibits the malfunction detector from performing detection according to a value of the cosine signal relative to a given value.

6. The malfunction detection device according to claim 1, wherein the prohibitor prohibits the malfunction detector from performing detection according to a square value of the cosine signal relative to a given value.

7. The malfunction detection device according to claim 1, wherein the test value calculation unit calculates a sum of a value obtained by squaring a sin θ representation of the sine signal, and a value obtained by squaring a cos θ representation of the cosine signal as the test value.

8. The malfunction detection device according to claim 1, wherein the malfunction detector determines that the resolver is malfunctioning when the test value is greater than or equal to a permissible upper limit value or higher or is less than or equal to a permissible lower limit.

9. The malfunction detection device according to claim 8, wherein a determination value indicative of a malfunction is different from a determination value indicative of no malfunction.

10. The malfunction detection device according to claim 1, wherein the counter is incremented only when a malfunction continues for at least a plurality of times.

11. A malfunction detection device which is attached to and detects a malfunction in a resolver that outputs a sine signal representative of sin θ and a cosine signal representative of cos θ according to a rotation angle θ of a rotating body, the malfunction detection device comprising:
- a test value calculator configured to calculate a test value on the basis of at least one of the sine signal and the cosine signal;
- a malfunction detector configured to detect a malfunction in the resolver according to whether or not the test value falls within a normal range;
- a prohibitor configured to prohibit detecting by said malfunction detector when the test value, based on the at least one of the sine signal and the cosine signal, falls within a normal state;
- a counter for increasing a count value when the malfunction detector detects that the resolver is malfunctioning;
- a resetter configured to reset the count value when the malfunction detector detects that the resolver is not malfunctioning; and
- a malfunction decider configured to decide that the resolver is malfunctioning when the count value is equal to or higher than a malfunction decision threshold value,
wherein the malfunction decider is configured to reset the count value when a time during which the count value does not reach the malfunction decision threshold value exceeds a given time.

12. A malfunction detection device which is attached to and detects a malfunction in a resolver that outputs a sine signal representative of sin θ and a cosine signal representative of cos θ according to a rotation angle θ of a rotating body, the malfunction detection device comprising:
- a test value calculator configured to calculate a test value on the basis of at least one of the sine signal and the cosine signal;
- a malfunction detector configured to detect a malfunction in the resolver according to whether or not the test value falls within a normal range;
- a prohibitor configured to prohibit detecting by said malfunction detector when the test value, based on the at least one of the sine signal and the cosine signal, falls within a normal state;
- a counter for increasing a count value when the malfunction detector detects that the resolver is malfunctioning;
- a resetter configured to reset the count value when the malfunction detector detects that the resolver is not malfunctioning;
- a malfunction decider configured to decide that the resolver is malfunctioning when the count value is equal to or higher than a malfunction decision threshold value; and
- a noise detector which is configured to increment a noise value when a square sum value of the test value, based on the at least one of the sine signal and the cosine signal, falls outside a permissible range,
wherein the counter is incremented when the noise value is equal to or greater than a specified value, and wherein both the noise value and the counter are reset when the square sum value falls outside the permissible range.

* * * * *